US010947153B2

(12) United States Patent
Biswas et al.

(10) Patent No.: US 10,947,153 B2
(45) Date of Patent: Mar. 16, 2021

(54) GREY COLORED COATED ARTICLE WITH LOW-E COATING HAVING ABSORBER LAYER AND LOW VISIBLE TRANSMISSION

(71) Applicants: GUARDIAN GLASS, LLC, Auburn Hills, MI (US); GUARDIAN GLASS HOLDING S.P.C., Manama (BH)

(72) Inventors: Aritra Biswas, Ras Al Khaimah (AE); Brent Boyce, Novi, MI (US); Allen Chu, Saline, MI (US); Philip J. Lingle, Temperance, MI (US); Kenneth Lord, Rochester Hills, MI (US); Muniswami Naidu, Ras Al Khaimah (AE); Venkata Krishnaswamy Naidu Vantaku, Ras Al Khaimah (AE)

(73) Assignees: GUARDIAN GLASS HOLDING S.P.C., Manama (BH); GUARDIAN GLASS, L.L.C, Auburn Hills, MI (US)

(*) Notice: Subject to any disclaimer, the term of this patent is extended or adjusted under 35 U.S.C. 154(b) by 0 days.

(21) Appl. No.: 16/343,264

(22) PCT Filed: Oct. 18, 2016

(86) PCT No.: PCT/US2016/057437
§ 371 (c)(1),
(2) Date: Apr. 18, 2019

(87) PCT Pub. No.: WO2018/075005
PCT Pub. Date: Apr. 26, 2018

(65) Prior Publication Data
US 2019/0248700 A1 Aug. 15, 2019

(51) Int. Cl.
B32B 15/04 (2006.01)
B32B 17/06 (2006.01)
(Continued)

(52) U.S. Cl.
CPC ............ *C03C 17/366* (2013.01); *B32B 17/06* (2013.01); *B32B 17/10229* (2013.01);
(Continued)

(58) Field of Classification Search
CPC ................ B32B 17/06; B32B 2419/00; B32B 2307/304; B32B 17/10036;
(Continued)

(56) References Cited

U.S. PATENT DOCUMENTS 5,557,462 A  9/1996  Hartig et al.
7,521,096 B2  4/2009  Lemmer et al.
(Continued)

FOREIGN PATENT DOCUMENTS

ES  2316065 T3  4/2009
JP  2004522677 A  7/2004
(Continued)

OTHER PUBLICATIONS

International Search Report and Written Opinion for International Application No. PCT/US16/57437, dated Jan. 9, 2017, pp. 8.
(Continued)

*Primary Examiner* — Lauren R Colgan

(57) ABSTRACT

A low-emissivity (low-E) coating on a substrate (e.g., glass substrate) includes at least first and second infrared (IR) reflecting layers (e.g., silver based layers) that are spaced apart by contact layers (e.g., NiCr based layers), a layer comprising silicon nitride, and an absorber layer of or including a material such as niobium zirconium which may be oxided and/or nitrided. The absorber layer is designed to allow the coated article to realize glass side reflective (equivalent to exterior reflective in an IG window unit when the coating is on surface #2 of the IG unit) grey color. In certain example embodiments, the coated article (monolithic form and/or in IG window unit form) has a low visible
(Continued)

transmission (e.g., from 20-45%, more preferably from 22-39%, and most preferably from 25-37%). In certain example embodiments, the coated article may be heat treated (e.g., thermally tempered and/or heat bent).

32 Claims, 2 Drawing Sheets

(51) Int. Cl.

| | | |
|---|---|---|
| *C03C 17/36* | (2006.01) | |
| *B32B 17/10* | (2006.01) | |
| *G02B 5/20* | (2006.01) | |
| *G02B 5/28* | (2006.01) | |
| *C23C 14/00* | (2006.01) | |
| *C23C 14/06* | (2006.01) | |
| *C23C 14/08* | (2006.01) | |
| *C23C 14/18* | (2006.01) | |
| *C23C 14/35* | (2006.01) | |

(52) U.S. Cl.
CPC ...... *C03C 17/3618* (2013.01); *C03C 17/3626* (2013.01); *C03C 17/3639* (2013.01); *C03C 17/3644* (2013.01); *C03C 17/3649* (2013.01); *C03C 17/3652* (2013.01); *C23C 14/0036* (2013.01); *C23C 14/0652* (2013.01); *C23C 14/083* (2013.01); *C23C 14/185* (2013.01); *C23C 14/35* (2013.01); *G02B 5/208* (2013.01); *G02B 5/282* (2013.01); *B32B 2255/205* (2013.01); *B32B 2255/28* (2013.01); *C03C 2217/73* (2013.01); *C03C 2218/155* (2013.01); *C03C 2218/156* (2013.01)

(58) Field of Classification Search
CPC .......... B32B 17/10229; C03C 17/3626; C03C 17/3649; C03C 17/3652; C03C 2217/78; C03C 17/366; C03C 17/3644; C03C 17/3411; C03C 17/36; C03C 17/3618; C03C 17/3681; C03C 17/3613; C03C 17/3639; C03C 17/361; C03C 17/3642
USPC ........ 428/426, 428, 432, 434, 688, 701, 702
See application file for complete search history.

(56) References Cited

U.S. PATENT DOCUMENTS

| | | | |
|---|---|---|---|
| 8,173,263 | B2 | 5/2012 | Lingle et al. |
| 10,378,271 | B2* | 8/2019 | Knoll .................. C03C 17/3652 |
| 2004/0005467 | A1 | 1/2004 | Neuman et al. |
| 2004/0214013 | A1 | 10/2004 | Stachowiak et al. |
| 2004/0224167 | A1* | 11/2004 | Stachowiak ...... B32B 17/10174 |
| | | | 428/432 |
| 2006/0046073 | A1 | 3/2006 | Neuman et al. |
| 2009/0068447 | A1* | 3/2009 | Blacker ................. C03C 17/366 |
| | | | 428/336 |
| 2009/0135319 | A1 | 5/2009 | Veerasamy |
| 2011/0261442 | A1* | 10/2011 | Knoll ...................... C03C 17/36 |
| | | | 359/360 |
| 2011/0262726 | A1 | 10/2011 | Knoll et al. |
| 2012/0177899 | A1 | 7/2012 | Unquera et al. |
| 2013/0088773 | A1* | 4/2013 | Knoll ...................... C03C 17/36 |
| | | | 359/360 |
| 2013/0216861 | A1* | 8/2013 | Imran ..................... C23C 14/35 |
| | | | 428/630 |
| 2014/0071524 | A1* | 3/2014 | Disteldorf ........... C03C 17/3441 |
| | | | 359/360 |
| 2014/0072784 | A1 | 3/2014 | Dietrich et al. |
| 2015/0140354 | A1 | 5/2015 | Pallotta et al. |
| 2016/0002101 | A1 | 1/2016 | Mahieu et al. |
| 2016/0185660 | A1 | 6/2016 | Disteldorf et al. |

FOREIGN PATENT DOCUMENTS

| | | |
|---|---|---|
| JP | 2011504450 A | 2/2011 |
| JP | 2015532256 A | 11/2015 |
| RU | 2563527 C2 | 9/2015 |
| RU | 2579049 C2 | 3/2016 |
| WO | 2014099476 A1 | 6/2014 |
| WO | WO2015023303 * | 2/2015 |

OTHER PUBLICATIONS

RU office action in RU application No. 2019115131/03, dated Mar. 5, 2020, pp. 16.
International Search Report and Written Opinion for International Application No. PCT/US16/57439, dated Jan. 9, 2017, pp. 9.
RU office action in RU application No. 2019115132/05, dated Feb. 5, 2020, pp. 19.
Extended European search report for EP application No. 16919318. 2, dated May 29, 2020, 8 pages.
GC examination report in GC application No. GC 2017-32803, dated Apr. 12, 2020, 3 pages.

* cited by examiner

GREY COLORED COATED ARTICLE WITH LOW-E COATING HAVING ABSORBER LAYER AND LOW VISIBLE TRANSMISSION

This application is the U.S. national phase of International Application No. PCT/US2016/057437 filed Oct. 18, 2016, the entire content of which is hereby incorporated by reference in this application.

This invention relates to a coated article including a low-emissivity (low-E) coating. In certain example embodiments, the low-E coating is provided on a substrate (e.g., glass substrate) and includes at least first and second infrared (IR) reflecting layers (e.g., silver based layers) that are spaced apart by contact layers (e.g., NiCr based layers), a layer comprising silicon nitride, and an absorber layer of or including a material such as niobium zirconium which may be oxided and/or nitrided. The absorber layer is designed to allow the coated article to realize glass side reflective/exterior grey color. In certain example embodiments, the coated article (monolithic form and/or in IG window unit form) has a low visible transmission (e.g., from 20-45%, more preferably from 22-39%, and most preferably from 25-37%). In certain example embodiments, the coated article may be heat treated (e.g., thermally tempered and/or heat bent). Coated articles according to certain example embodiments of this invention may be used in the context of insulating glass (IG) window units, vehicle windows, other types of windows, or in any other suitable application.

BACKGROUND OF THE INVENTION

Coated articles are known in the art for use in window applications such as insulating glass (IG) window units, vehicle windows, and/or the like. It is known that in certain instances, it is desirable to heat treat (e.g., thermally temper, heat bend and/or heat strengthen) such coated articles for purposes of tempering, bending, or the like. Heat treatment (HT) of coated articles typically requires use of temperature(s) of at least 580 degrees C., more preferably of at least about 600 degrees C. and still more preferably of at least 620 degrees C. Such high temperatures (e.g., for 5-10 minutes or more) often cause coatings to break down and/or deteriorate or change in an unpredictable manner. Thus, it is desirable for coatings to be able to withstand such heat treatments (e.g., thermal tempering), if desired, in a predictable manner that does not significantly damage the coating.

In certain situations, designers of coated articles strive for a combination of desirable visible transmission, desirable color, low emissivity (or emittance), and low sheet resistance ($R_s$). Low-emissivity (low-E) and low sheet resistance characteristics permit such coated articles to block significant amounts of IR radiation so as to reduce for example undesirable heating of vehicle or building interiors.

Grey coloration is sometimes desired in the context of monolithic windows, insulating glass (IG) window units, and/or other suitable applications. Desirable grey coloration (e.g., glass side reflective, or exterior), measured monolithically and/or in an IG window unit, may be characterized by: a* values of from −4.0 to +5.0, more preferably from −3.5 to +1.0, and most preferably −2.5 to 0; in combination with b* values of from −10.0 to +2.0, more preferably from −9.0 to +1.0, and most preferably from −7.0 to −1.0; in combination with a glass side visible reflectance ($R_{GY}$ or $R_{OUT}$) of from 10-24%, more preferably from 12-20%, and most preferably from 13-19%; and a visible transmission (TY or $T_{vis}$) of from 20-45%, more preferably from 22-39%, and most preferably from 25-37%. Note that optical values (e.g., a*, b*, $T_{vis}$, $R_{GY}$, $R_{FILM}$) herein are measured in accordance with the Illuminant C, 2 degree, standard.

Low solar factor (SF) and solar heat gain coefficient (SHGC) values are also desired in some applications, particularly in warm weather climates. Solar factor (SF), calculated in accordance with EN standard 410, relates to a ratio between the total energy entering a room or the like through a glazing and the incident solar energy. Thus, it will be appreciated that lower SF values are indicative of good solar protection against undesirable heating of rooms or the like protected by windows/glazings. A low SF value is indicative of a coated article (e.g., IG window unit) that is capable of keeping a room fairly cool in summertime months during hot ambient conditions. Thus, low SF values are sometimes desirable in hot environments. While low SF values are sometimes desirable for coated articles such as IG window units, the achievement of lower SF values may come at the expense of sacrificing coloration. It is often desirable, but difficult, to achieve a combination of acceptable visible transmission, desirable glass side reflective coloration, and a low SF value for a coated article such as an IG window unit or the like. SF (G-Factor; EN410-673 2011) and SHGC (NFRC-2001) values are calculated from the full spectrum (T, Rg and Rf) and are typically measured with a spectrophotometer such as a Perkin Elmer 1050. The SF measurements are done on monolithic coated glass, and the calculated values can be applied to monolithic, IG and laminated applications.

U.S. Patent Document 2012/0177899 discloses several different coatings. The Examples 1, 4 and 5 on page four of US '899 in [0026] are glass/SiN/NiCrNx/SiN/NiCrNx/SiN. However, these examples have undesirably high sheet resistance values of from 40-75 ohms/square, and undesirable green or bronze glass side reflective coloration. Unfortunately, all Examples in US '899 suffer from undesirably high sheet resistance values of from 40-75 ohms/square, and undesirably high SF and SHGC values.

U.S. Pat. No. 7,521,096, incorporated herein by reference, discloses a low-E coating which uses zinc oxide (ZnO) contact layers below the silver-based IR reflecting layers, and above the bottom silver (Ag) based IR reflecting layer uses a $NiCrO_x$ contact layer followed by a center tin oxide ($SnO_2$) dielectric layer. While the ZnO contact layers below the silver IR reflecting layers provide good structural properties for the growth of silver, the ZnO has been found to degrade the chemical, environmental and mechanical durability of the coating in certain instances. Moreover, the thick $SnO_2$ dielectric layer has been found to show micro crystallization and stress upon HT which causes rough interfaces between the $SnO_2$, the ZnO and the Ag, which can lead to degradation of durability and affect transmitted color.

U.S. Pat. No. 5,557,462 discloses a low-E coating with a layer stack of SiN/NiCr/Ag/NiCr/SiN/NiCr/Ag/NiCr/SiN. However, the coated article of the '462 patent has an undesirably high visible transmission of at least 63%. The '462 patent at column 3, lines 12-15, teaches that visible transmission below 70% (monolithic coated article) and below 63% (IG window unit) are undesirable. Thus, the '462 patent teaches directly away from coated articles with visible transmission lower than 63%. Moreover, as largely explained in U.S. Pat. No. 8,173,263, coated articles of the '462 patent are not reasonably heat treatable at least because upon heat treatment sheet resistance ($R_s$) goes way up such as from about 3-5 to well over 10.

U.S. Patent Document 2016/0185660 discloses a low-E coating with a layer stack of SiN/NiCr/Ag/NiCr/SiN/NiCr/Ag/NiCr/SiN/ZrO. However, it has been found here that durability of this layer stack can be improved upon. Moreover, the example coated articles described in the '660 patent, namely Examples 1-3, have undesirably high visible transmissions of over 47%, and often cannot meet desirable grey glass side/exterior coloration together with an glass side/exterior visible reflectivity ($R_{GY}$) of at least 10%. Thus, there is room for improvement regarding the '660 patent document with respect to one or more of durability, visible transmission, coloration, and/or glass side visible reflectance.

Thus, it would be desirable if grey glass side reflective coloration could be achieved, measured monolithically and/or in an IG window unit, in combination with good durability, low sheet resistance, low visible transmission, and low SF and/or SHGC value(s). Note that a typical conventional IG window unit with two panes has an SHGC value around 0.70.

BRIEF SUMMARY OF EXAMPLE EMBODIMENTS OF THE INVENTION

Example embodiments of this invention relate to a coated article including a low-emissivity (low-E) coating. In certain example embodiments, the low-E coating is provided on a substrate (e.g., glass substrate) and includes at least first and second infrared (IR) reflecting layers (e.g., silver based layers) that are spaced apart by contact layers (e.g., NiCr based layers) and a dielectric layer of or including a material such as silicon nitride and an absorber layer of or including a material such as niobium zirconium which may be oxided (e.g., $NbZrO_x$) and/or nitrided (e.g., $NbZrO_xN_y$). The addition of the absorber layer, which if oxided is preferably sub-oxided (partially oxided) and which if nitrided is preferably sub-nitrided (partially nitride with fairly small amounts of nitrogen), has been found to increase durability and can be utilized to provide desirable grey glass side/exterior reflective coloration, low visible transmission, desirable glass side reflectance values, desirable transmissive color and more desirable film side reflective b* values, and low SF and SHGC value(s). In certain example embodiments, the coated article (monolithic form and/or in IG window unit form) has a low visible transmission (e.g., from 20-45%, more preferably from 22-39%, and most preferably from 25-37%). In certain example embodiments, the coated article may be heat treated (e.g., thermally tempered and/or heat bent). Coated articles according to certain example embodiments of this invention may be used in the context of insulating glass (IG) window units, vehicle windows, other types of windows, or in any other suitable application.

In certain example embodiments of this invention, there is provided a coated article including a coating supported by a glass substrate and having grey glass side reflective color, the coating comprising: first and second infrared (IR) reflecting layers comprising silver, the first IR reflecting layer being located closer to the glass substrate than is the second IR reflecting layer; a first contact layer located over and directly contacting the first IR reflecting layer comprising silver; a dielectric layer comprising silicon nitride located over and directly contacting the first contact layer; wherein the dielectric layer comprising silicon nitride is split by a splitting absorber layer comprising Nb and Zr, so that the splitting absorber layer comprising Nb and Zr is located between and contacting a first portion of the dielectric layer comprising silicon nitride and a second portion of the dielectric layer comprising silicon nitride; a second contact layer located over the layer comprising silicon nitride; the second IR reflecting layer comprising silver located over and directly contacting the second contact layer; a third contact layer located over and directly contacting the second IR reflecting layer; another dielectric layer comprising silicon nitride located over the third contact layer; wherein the coated article has a visible transmission of from 20-45% and a glass side visible reflectance of from 10-24%; and wherein the coated article has grey glass side reflective coloration so that the coated article has a glass side reflective a* value from −4.0 to +5.0 and a glass side reflective b* value from −10.0 to +2.0.

In certain example embodiments of this invention, there is provided a coated article including a coating supported by a glass substrate, the coating comprising: first and second infrared (IR) reflecting layers comprising silver, the first IR reflecting layer being located closer to the glass substrate than is the second IR reflecting layer; a first contact layer located over and directly contacting the first IR reflecting layer comprising silver; a dielectric layer comprising silicon nitride located over and directly contacting the first contact layer; wherein the dielectric layer comprising silicon nitride is split by a splitting layer comprising $NbZrO_xN_y$, so that the splitting layer comprising $NbZrO_xN_y$ is located between and contacting a first portion of the dielectric layer comprising silicon nitride and a second portion of the dielectric layer comprising silicon nitride; a second contact layer located over the layer comprising silicon nitride; the second IR reflecting layer comprising silver located over and directly contacting the second contact layer; a third contact layer located over and directly contacting the second IR reflecting layer; and wherein the coated article has a visible transmission of from 20-45%.

DETAILED DESCRIPTION OF EXAMPLE EMBODIMENTS OF THE INVENTION

Figure 1:
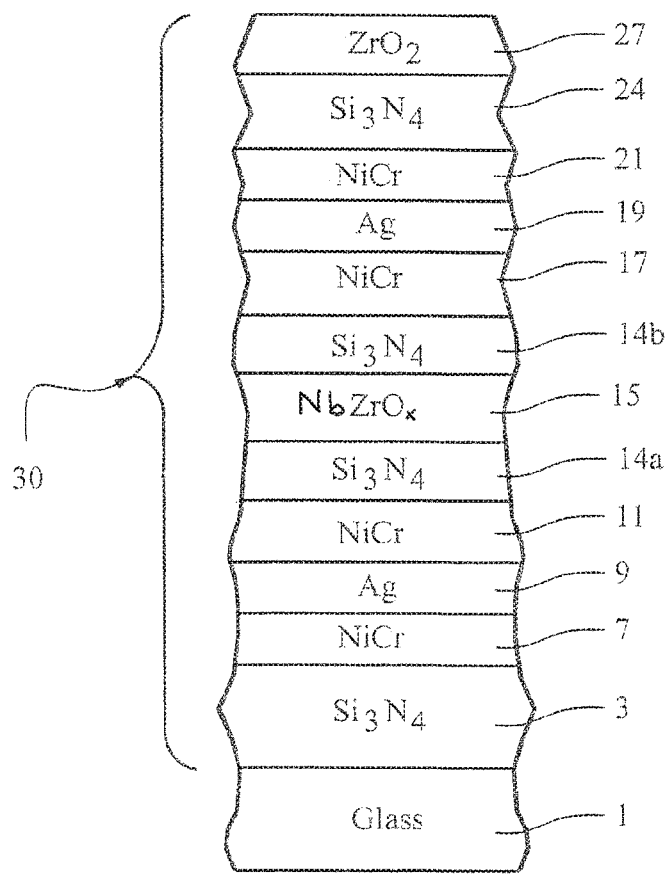
FIG. 1 is a cross sectional view of a coated article according to an example embodiment of this invention.

Coated articles herein may be used in applications such as IG window units, laminated window units (e.g., for use in vehicle or building applications), vehicle windows, monolithic architectural windows, residential windows, and/or any other suitable application that includes single or multiple glass substrates.

Certain embodiments of this invention relate to a coated article including a low-emissivity (low-E) coating 30. In certain example embodiments, the low-E coating 30 is provided on (directly or indirectly) a substrate (e.g., glass substrate) 1 and includes at least first and second infrared (IR) reflecting layers (e.g., silver based layers) 9, 19 that are spaced apart by contact layers (e.g., NiCr based layers) 11, 17 and a dielectric layer 14 of or including a material such as silicon nitride and an absorber layer 15 of or including a material such as niobium zirconium which may be oxided (e.g., $NbZrO_x$) and/or nitrided (e.g., $NbZrO_xN_y$) in a substoichiometric manner. The addition of the absorber layer 15, which if oxided is preferably sub-oxided (partially oxided) and which if nitrided is preferably sub-nitrided (partially nitrided with fairly small amounts of nitrogen), has been found to increase durability and can be utilized to provide desirable grey glass side/exterior reflective coloration, low visible transmission, desirable glass side reflectance values, desirable transmissive color and more desirable film side reflective b* values, and low SF and SHGC value(s). Thus, the absorber layer 15 has been found to advantageously provide acceptable thermal performance in combination with desirable indoor and outdoor transmissive and/or reflective color. In certain example embodiments, the coated article (monolithic form and/or in IG window unit form) has a low visible transmission (e.g., from 20-45%, more preferably from 22-39%, and most preferably from 25-37%). In certain example embodiments, the coated article may be heat treated (e.g., thermally tempered and/or heat bent). In example embodiments of this invention, the coated article, if an insulating glass (IG) window unit having two glass substrates, has an SF value of no greater than 0.28 (more preferably no greater than 0.25, and most preferably no greater than 0.23) and/or an SHGC value of no greater than 0.29 (more preferably no greater than 0.25, and most preferably no greater than 0.23). Thus, such coatings provide for improved color control and/or ranges when desired, good durability and desirable visible transmission values, and desirable low SF and/or SHGC values indicating ability to keep rooms cool in warm environments.

The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. The coated article may or may not be heat treated in different embodiments of this invention.

In certain example embodiments of this invention, the coating includes a double-silver stack. Referring to FIG. 1 for example, in certain example embodiments of this invention, there is provided a coated article including a coating supported by a glass substrate, the coating comprising: first 9 and second 19 infrared (IR) reflecting layers comprising or consisting essentially of silver, the first IR reflecting layer 9 being located closer to the glass substrate 1 than is the second IR reflecting layer 19; a first contact layer comprising NiCr 7 located under and directly contacting the first IR reflecting layer comprising silver 9, a second contact layer 11 located over and directly contacting the first IR reflecting layer comprising silver 9; a dielectric layer comprising silicon nitride 14 (the layer 14 is made up of lower layer portion 14a and upper layer portion 14b) located over and directly contacting the first contact layer comprising NiCr 11; wherein the dielectric layer comprising silicon nitride 14 is split by an absorbing layer 15 of or including niobium zirconium which may be sub-oxided and/or sub-nitrided, so that the absorbing layer 15 is located between and contacting lower portion 14a of the dielectric layer comprising silicon nitride and upper portion 14b of the dielectric layer comprising silicon nitride; a third contact layer comprising NiCr 17 located over and directly contacting the upper portion 14b of the layer comprising silicon nitride 14; the second IR reflecting layer comprising silver 19 located over and directly contacting the second contact layer comprising NiCr 17; a fourth contact layer comprising NiCr 21 located over and directly contacting the second IR reflecting layer 19. The first and second IR reflecting layers 9 and 19 comprising silver may be substantially the same thickness (the same thickness +/−10%) in certain example embodiments of this invention, which has been surprisingly found to result in desirable grey glass side/exterior reflective coloration to be achieved in combination with low visible transmission and other desirable optical and/or solar characteristics. The provision of the absorbing layer 15, splitting the silicon nitride based layer 14 into two equal or unequal portions, has also been found to improve durability. The coating 30 may include three dielectric layers 3, 14 and 24 of or including silicon nitride, as shown in FIG. 1. Moreover, the coating 30 may include a layer (e.g., overcoat) 27 of or including zirconium oxide and/or zirconium oxynitride in certain example embodiments. In certain example embodiments, this layer of or including zirconium oxide and/or zirconium oxynitride 27 is thinner than one or both of the IR reflecting layers 9, 19 comprising silver in the coating. In certain example embodiments of this invention, each of the IR reflecting layers comprising silver 9 and 19 is at least twice as thick, and more preferably at least three times as thick, as the layer 27 or including zirconium oxide and/or zirconium oxynitride. In certain example embodiments of this invention, the coating includes only two IR reflecting layers 9, 19 of or including silver or the like.

In order to increase durability and to provide for desirable grey glass side/exterior coloration in combination with low sheet resistance and desirable optical/solar features, along with optics and thermal properties, coated articles according to certain example embodiments of this invention have a center dielectric layer 14 of or including silicon nitride split by the niobium zirconium inclusive absorber layer 15, and lower contact layers 7, 17 are based on NiCr (as opposed to ZnO). It has also been found that using metallic or substantially metallic NiCr (possibly partly nitrided) for layer(s) 7, 11, 17 and/or 21 improves chemical, mechanical and environmental durability (compared to using ZnO lower contact layers below silver and/or highly oxided NiCr upper contact layers above silver). However, ZnO may still be used in alternative embodiments. It has also been found that sputter-depositing silicon nitride inclusive layer 14 in an amorphous state, so that it is amorphous in both as-coated and HT states, helps with overall stability of the coating. For example, 5% HCl at 65 degrees C. for one hour will remove the coating of U.S. Pat. No. 7,521,096, whereas the coating shown in FIG. 1 and the examples herein can survive this HCl test. And in high temperature and high humidity environment, there is less damage to the coating of FIG. 1 and the examples herein after ten days of exposure, than to the coating of the '096 patent after two days of exposure. And regarding high corrosive chemicals such as those used for "brick wash", corrosion resistance is such that edge deletion need not be performed in certain example IG and laminated embodiments. Similarly, for mechanical abrasion tests, thermal cycling and salt fog tests, the coatings of the examples herein were found to be better than that of the '096 patent.

In certain example embodiments of this invention such as FIG. 1, heat treated or non-heat-treated coated articles having multiple IR reflecting layers (e.g., two spaced apart silver based layers) are capable of realizing a sheet resistance ($R_s$) of less than or equal to 7.0 (more preferably less than or equal to 6.0, even more preferably less than or equal to 5.0). The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. The coated article may or may not be heat treated in different embodiments of this invention.

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and low-E coating (or layer system) 30 provided on the substrate 1 either directly or indirectly. The coating (or layer system) 30 includes, for example: bottom dielectric silicon nitride layer 3 which may be $Si_3N_4$, or of the Si-rich type silicon nitride for haze reduction, or of any other suitable stoichiometry silicon nitride in different embodiments of this invention, lower contact layer 7 (which contacts bottom IR reflecting layer 9), first conductive and preferably metallic or substantially metallic infrared (IR) reflecting layer 9, upper contact layer 11 (which contacts IR reflecting layer 9), dielectric silicon nitride based and/or inclusive layer 14 split into two portions 14a, 14b by absorber layer 15, lower contact layer 17 (which contacts IR reflecting layer 19), second conductive and preferably metallic or substantially metallic IR reflecting layer 19, upper contact layer 21 (which contacts layer 19), dielectric silicon nitride layer 24 which may be $Si_3N_4$, of the Si-rich type for haze reduction, or of any other suitable stoichiometry silicon nitride in different embodiments of this invention, and overcoat layer 27 of or including a material such as zirconium oxide (e.g., $ZrO_2$) and/or zirconium oxynitride. The "contact" layers 7, 11, 17 and 21 each contact an IR reflecting layer (e.g., layer based on Ag). The aforesaid layers 3-27 make up low-E (i.e., low emissivity) coating 30 that is provided on glass or plastic substrate 1. Layers 3-27 may be sputter-deposited on the substrate 1 in certain example embodiments of this invention, with each layer being sputter-deposited in vacuum using one or more targets as needed (the sputtering targets may be ceramic or metallic). Metallic or substantially metallic layers (e.g., layers 7, 9, 11, 17, 19 and 21) may be sputtered in an atmosphere containing argon gas, whereas nitrided layers (e.g., layers 3, 7, 11, 14, 17, 21 and/or 24) may be sputtered in an atmosphere containing a mixture of nitrogen and argon gas. Absorber layer 15 is preferably sputter-deposited from an NbZr target(s) in an atmosphere having a mixture of argon (Ar) and a small amount of oxygen (and possibly) nitrogen gas(es). The contact layers 7, 11, 17 and 21 may or may not be nitrided in different example embodiments of this invention.

Figure 2:
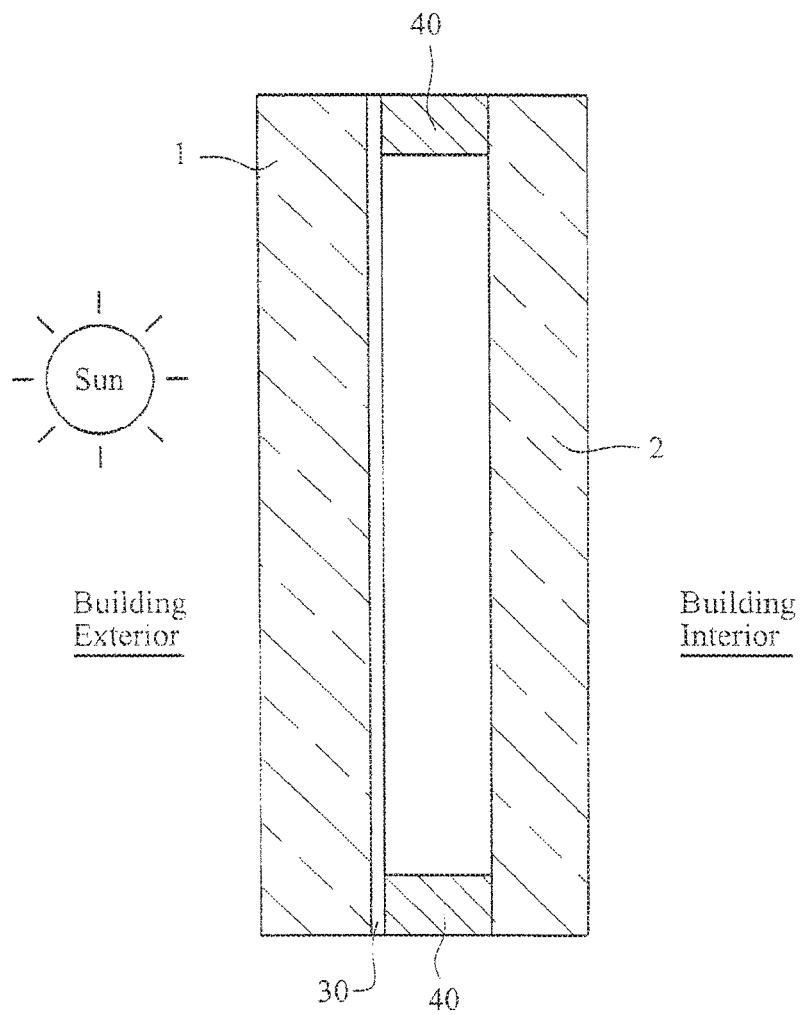
FIG. 2 is a cross sectional view showing the coated article of FIG. 1 provided in an IG window unit according to an example embodiment of this invention.

In monolithic instances, the coated article includes only one glass substrate 1 as illustrated in FIG. 1. However, monolithic coated articles herein may be used in devices such as laminated vehicle windshields, IG window units, and the like. As for IG window units, an IG window unit may include two spaced apart glass substrates. An example IG window unit is illustrated and described, for example, in U.S. Patent Document No. 2004/0005467, the disclosure of which is hereby incorporated herein by reference. FIG. 2 shows an example IG window unit including the coated glass substrate 1 shown in FIG. 1 coupled to another glass substrate 2 via spacer(s), sealant(s) 40 or the like, with a gap being defined therebetween. This gap between the substrates in IG window unit embodiments may in certain instances be filled with a gas such as argon (Ar). An example IG unit may comprise a pair of spaced apart clear glass substrates, which may be matte glass substrates in certain example instances, each about 3-7 mm (e.g., 6 mm) thick, one of which is coated with a coating 30 herein in certain example instances, where the gap between the substrates may be from about 5 to 30 mm, more preferably from about 10 to 20 mm, and most preferably about 16 mm. In certain example instances, the low-E coating 30 may be provided on the interior surface of either substrate facing the gap (the coating is shown on the interior major surface of substrate 1 in FIG. 2 facing the gap, but instead could be on the interior major surface of substrate 2 facing the gap). Either substrate 1 or substrate 2 may be the outermost substrate of the IG window unit at the building exterior (e.g., in FIG. 2 the substrate 1 is the substrate closest to the building exterior, and the coating 30 is provided on surface #2 of the IG window unit). While FIG. 2 shows the coating 30 on surface #2 of the IG window unit (so that glass side reflective color is viewed from the exterior of the building), it is possible that the coating 30 may be provided on surface #3 of the IG window unit in alterative embodiments in which case glass side reflective color would be as viewed from the interior of the building.

In certain example embodiments of this invention, one, two, three, or all four of contact layers 7, 11, 17, 21 may be of or include NiCr (any suitable ratio of Ni:Cr), and may or may not be nitrided ($NiCrN_x$). In certain example embodiments, one, two, three or all four of these NiCr inclusive layers 7, 11, 17, 21 is substantially or entirely non-oxidized. In certain example embodiments, layers 7, 11, 17 and 21 may all be of metallic NiCr or substantially metallic NiCr (although trace amounts of other elements may be present). In certain example embodiments, one, two, three or all four of NiCr based layers 7, 11, 17, 21 may comprise from 0-10% oxygen, more preferably from 0-5% oxygen, and most preferably from 0-2% oxygen (atomic %). In certain example embodiments, one, two, three or all four of these layers 7, 11, 17, 21 may contain from 0-20% nitrogen, more preferably from 1-15% nitrogen, and most preferably from about 1-12% nitrogen (atomic %). NiCr based layers 7, 11, 17 and/or 21 may or may not be doped with other material(s) such as stainless steel, Mo, or the like. It has been found that the use of NiCr based contact layer(s) 7 and/or 17 under the silver-based IR reflecting layer(s) 9, 19 improves durability of the coated article (compared to if layers 7 and 17 were instead of ZnO).

Dielectric layers 3, 14 (including 14a and 14b), and 24 may be of or include silicon nitride in certain embodiments of this invention. Silicon nitride layers 3, 14 and 24 may, among other things, improve heat-treatability of the coated articles and protect the other layers during optional HT, e.g., such as thermal tempering or the like. One or more of the silicon nitride layers 3, 14, 24 may be of the stoichiometric type (i.e., $Si_3N_4$), or alternatively of the Si-rich type of silicon nitride in different embodiments of this invention. The presence of free Si in a Si-rich silicon nitride inclusive layer 3 and/or 14 may, for example, allow certain atoms such as sodium (Na) which migrate outwardly from the glass 1 during HT to be more efficiently stopped by the Si-rich silicon nitride inclusive layer(s) before they can reach silver and damage the same. Thus, it is believed that the Si-rich $Si_xN_y$ can reduce the amount of damage done to the silver layer(s) during HT in certain example embodiments of this invention thereby allowing sheet resistance ($R_s$) to decrease or remain about the same in a satisfactory manner. Moreover, it is believed that the Si-rich $Si_xN_y$ in layers 3, 14 and/or 24 can reduce the amount of damage (e.g., oxidation) done to the silver and/or NiCr during HT in certain example optional embodiments of this invention. In certain example embodiments, when Si-rich silicon nitride is used, the Si-rich silicon nitride layer (3, 14 and/or 24) as deposited may be characterized by $Si_xN_y$ layer(s), where x/y may be from 0.76 to 1.5, more preferably from 0.8 to 1.4, still more preferably from 0.82 to 1.2. Any and/or all of the silicon nitride layers discussed herein may be doped with other materials such as stainless steel or aluminum in certain example embodiments of this invention. For example, any and/or all silicon nitride layers 3, 14, 24 discussed herein may optionally include from about 0-15% aluminum, more preferably from about 1 to 10% aluminum, in certain example embodiments of this invention. The silicon nitride of layers 3, 14, 24 may be deposited by sputtering a target(s) of Si or SiAl, in an atmosphere having argon and nitrogen gas, in certain embodiments of this invention. Small amounts of oxygen may also be provided in certain instances in any or all of the silicon nitride layers 3, 14, 24.

Absorber layer 15 is preferably of or including niobium zirconium, which may be sub-oxided and/or nitrided in certain example embodiments. It has been found that provision of the niobium zirconium based absorber layer 15 in a position to split the silicon nitride based layer 14 into two portions 14a and 14b results in improved durability, and allows desirable grey glass side/exterior coloration to be achieved in combination with other desirable optical/solar characteristics. For instance, when NbZr (or an oxide thereof) is used for absorber layer 15, various ratios of Nb to Zr in the layer may be used including but not limited to a 50/50 ratio, an 85/15 ratio, or a 90/10 ratio. In certain example embodiments of this invention, the Nb/Zr ratio in absorber layer 15 may be from 1/1 to 9.5/1 (more preferably from 2/1 to 9/1) in various example embodiments of this invention, such that the layer 15 preferably contains more Nb than Zr. In certain example embodiments, the metal content of absorber layer is from 50-95% Nb, more preferably from 60-95% Nb, even more preferably from 70-95% Nb (e.g., with the remainder of the metal content being made up of Zr in certain example embodiments). While layer 15 consists of, or consists essentially of, NbZr, NbZrO$_x$, or NbZrO$_x$N$_y$ in preferred embodiments of this invention, it is possible that other materials may be present in the layer. For instance, layer 15 may be doped with other materials in certain example instances. In certain example embodiments the absorber layer 15 may contain from about 0-10% nitrogen, more preferably from about 1-7% nitrogen. As mentioned herein, it is preferable that absorber layer 15 is not fully oxided, but is partially oxided (sub-oxided) in certain example embodiments of this invention. In certain example embodiments, absorber layer 15 contains from about 0-40% oxygen, more preferably from 1-35% oxygen, even more preferably from 3-30%, even more preferably from 5-20% oxygen (atomic %). The oxygen content of the layer 15 may be adjusted in order to adjust visible transmission in certain example instances. In certain example embodiments, there is more oxygen than nitrogen in absorber layer 15 (regarding atomic %).

While the absorber layer 15 is of NbZr, NbZrO$_x$, or NbZrO$_x$N$_y$ in preferred embodiments of this invention, other materials are also possible in alternative embodiments. For example, it is possible that the absorber layer 15 may be of or include NiCr, NiCrO$_x$, or NiCrO$_x$N$_y$ in other embodiments of this invention Infrared (IR) reflecting layers 9 and 19 are preferably substantially or entirely metallic and/or conductive, and may comprise or consist essentially of silver (Ag), gold, or any other suitable IR reflecting material. IR reflecting layers 9 and 19 help allow the coating to have low-E and/or good solar control characteristics.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses and materials may be used in layers in different embodiments of this invention, example thicknesses and materials for the respective layers on the glass substrate 1 in the FIG. 1 embodiment are as follows, from the glass substrate outwardly (physical thicknesses recited):

| Example Materials/Thicknesses; FIG. 1 Embodiment | | | |
|---|---|---|---|
| Layer Glass (1-10 mm thick) | Preferred Range (Å) | More Preferred (Å) | Example (Å) |
| Si$_x$N$_y$ (layer 3) | 100-1100 Å | 400-1000 Å | 606 Å |
| NiCr or NiCrN (layer 7) | 5-70 Å | 7-30 Å | 8 Å |
| Ag (layer 9) | 60-170 Å | 80-120 Å | 103 Å |
| NiCr or NiCrN (layer 11) | 5-70 Å | 10-35 Å | 17 Å |
| Si$_x$N$_y$ (layer 14a) | 100-700 Å | 200-550 Å | 458 Å |
| NbZrO$_x$ (layer 15) | 15-100 Å | 20-60 Å | 38 Å |
| Si$_x$N$_y$ (layer 14b) | 100-700 Å | 200-550 Å | 402 Å |
| NiCr or NiCrN (layer 17) | 5-70 Å | 10-35 Å | 15 Å |
| Ag (layer 19) | 60-170 Å | 80-120 Å | 105 Å |
| NiCr or NiCrN (layer 21) | 5-70 Å | 7-30 Å | 8 Å |
| Si$_3$N$_4$ (layer 24) | 100-500 Å | 200-400 Å | 305 Å |
| ZrO$_2$ (layer 27) | 20-85 Å | 25-55 Å | 37 Å |

The lower and upper portions 14a and 14b of the silicon nitride based layer 14 are substantially the same physical thickness (the same thickness +/−20%) in certain example embodiments of this invention, although they need not be in alternative embodiments of this invention. The two IR reflecting layers 9 and 19 are substantially the same physical thickness (the same thickness+/−20%) in certain example embodiments as well. Moreover, in certain example embodiments of this invention the absorber layer 15 is thinner than both the silver layers 9, 19 (e.g., by at least 20 angstroms), and is also thinner than both of the silicon nitride layers 14a, 14b in certain example embodiments of this invention. In certain example embodiments of this invention, the absorber layer 15 is at least 20 angstroms (Å) thinner than both the silver layers 9, 19, and/or is at least angstroms 100 angstroms (more preferably at least 200 angstroms, and most preferably at least 250 angstroms) thinner than both of the silicon nitride layers 14a, 14b in certain example embodiments of this invention.

In certain example embodiments, the overcoat layer of or including zirconium oxide and/or zirconium oxynitride 27 is thinner than each of the IR reflecting layers 9, 19 comprising silver in the coating 30. In certain example embodiments of this invention, each of the IR reflecting layers comprising silver 9 and 19 is at least twice as thick as the overcoat layer 27 or including zirconium oxide and/or zirconium oxynitride.

In certain example embodiments, the center silicon nitride based layer 14 total thickness (14a+14b) is thicker than the silicon nitride layer 24 thickness, preferably by at least 100 angstroms, more preferably by at least 300 angstroms, and most preferably by at least 400 angstroms. In certain example embodiments, silicon nitride layer 3 is at least 50 angstroms thicker (more preferably at least 100 angstroms thicker) than each of silicon nitride based layers 14a and 14b. Moreover, in certain example embodiments, each of the silicon nitride based layers 3, 14 and 24 is at least two times as thick as the zirconim oxide inclusive layer 27, more preferably at least three times as thick, and most preferably at least four or five times as thick.

Before and/or after any optional heat treatment (HT) such as thermal tempering, in certain example embodiments of this invention coated articles according to the FIG. 1 embodiment have color/optical characteristics as follows in Table 2 (measured monolithic and/or in an IG unit). It is noted that subscript "G" stands for glass side reflective, subscript "T" stands for transmissive, and subscript "F" stands for film side reflective. As is known in the art, glass side (G) means when viewed from the glass side (as opposed to the layer/film side) of the coated article, i.e., same as when viewed from the exterior side of a window when viewed from a building exterior when the coating is on the inner side of the outer glass substrate 1 as shown in FIG. 2 for instance. Film side (F) means when viewed from the side of the coated article on which the coating is provided. The characteristics below in Table 2 are applicable to HT and/or non-HT coated articles herein. However, HT will cause certain parameters to change such as increasing visible transmission and lowering sheet resistance (color values will also change due to HT).

TABLE 2

Color/Optical Characteristics (FIG. 1 embodiment monolithic or IG)

|  | General | Preferred | Most Preferred |
| --- | --- | --- | --- |
| $T_{vis}$ (TY): | 20-45% | 22-39% | 25-37% |
| $a^*_T$ | −10 to +2 | −8 to −1 | −6.5 to −3.0 |
| $b^*_T$ | −12 to +4 | −8 to +1 | −6 to −1 |
| $R_GY$(glass side): | 10-24% | 12-20% | 13-19% |
| $a^*_G$ | −4 to +5 | −3.5 to +1 | −2.5 to 0 |
| $b^*_G$ | −10 to +2 | −9 to +1 | −7 to −1 |
| $R_FY$(film side): | <=17% | <=15% | <=12% |
| $a^*_F$ | −5 to +13 | −2 to +10 | 0 to +5 |
| $b^*_F$ | −6 to +13 | −4 to +9 | −3 to +7 |
| $R_s$ (Ω/sq): | ≤7.0 | ≤6.0 | ≤5.0 |
| SF [IG]: | <=0.28 | <=0.25 | <=0.23 |
| SHGC [IG]: | <=0.29 | <=0.25 | <=0.23 (or .22) |

For purposes of example only, Examples 1-2 below represent different example embodiments of this invention.

EXAMPLES

Examples 1 and 2 has the below-listed layer stack on a 5.9 mm thick, 75 mm×75 mm, clear matte glass substrate 1 as shown in FIG. 1. The examples were measured monolithically, heat treated and measured again after the HT. They were also put into IG window units after HT as shown in FIG. 2, and measured. The silicon nitride layers 3, 14, 24 in each example were deposited by sputtering a silicon target (doped with about 8% Al) in an atmosphere including argon and nitrogen gas. In the IG window unit, the matte glass substrates 1 and 2 were clear and 5.9 mm thick, and the air gap between the substrates in the IG window unit was 13 mm thick. The NbZr based absorber layers in each example were deposited by sputtering approximately 90/10 Nb/Zr magnetron sputtering targets in an atmosphere including argon and a small amount of nitrogen and oxygen gas (1.2 ml/kW of oxygen gas was used). Thus, the absorber layer 15 was of $NbZrO_xN_y$ in these examples. Layer thicknesses for Examples 1-2 were in angstroms (Å) and are as follows, moving from the glass substrate 1 outwardly.

TABLE 3

Layer Stacks of Examples 1-2

| Layer<br>Glass (5.9 mm thick) | Examples 1-2 |
| --- | --- |
| $Si_3N_4$ (layer 3) | 606 Å |
| NiCr (layer 7) | 8 Å |
| Ag (layer 9) | 103 Å |
| NiCr (layer 11) | 17 Å |
| $Si_xN_y$ (layer 14a) | 458 Å |
| $NbZrO_xN_y$ (layer 15) | 38 Å |
| $Si_xN_y$ (layer 14b) | 402 Å |
| NiCr (layer 17) | 15 Å |
| Ag (layer 19) | 105 Å |
| NiCr (layer 21) | 8 Å |
| $Si_3N_4$ (layer 24) | 305 Å |
| $ZrO_2$ (layer 27) | 37 Å |

Measured monolithically before tempering (HT), Examples 1-2 according to embodiments of this invention had the following characteristics with the measurements being taken from the center of the coated glass article (annealed and non-HT, monolithic) (Ill. C, 2 degree observer).

TABLE 4

Measured Monolithic, annealed (as coated: before tempering)

| Parameter | Ex. 1 | Ex. 2 |
| --- | --- | --- |
| $T_{vis}$ (TY)(transmission): | 29.2% | 29.2% |
| $a^*_T$ | −3.5 | −3.5 |
| $b^*_T$ | −1.5 | −1.4 |
| $R_GY$(glass side refl. %): | 14.7% | 14.7% |
| $a^*_G$: | 1.9 | 2.0 |
| $b^*_G$: | −5.7 | −5.8 |
| Glass side refl. color: | grey | grey |
| $R_FY$(film side refl. %): | 4.2% | 4.1% |
| $a^*_F$: | 1.4 | 1.6 |
| $b^*_F$: | 6.0 | 5.4 |
| Sheet Resistance (Ω/sq): | 4.0 | 4.1 |

It can be seen from Table 4 above that measured monolithically prior to any optional thermal tempering Examples 1-2 were able to realize a combination of (i) desirable grey glass side reflective visible color, (ii) a low sheet resistance, (iii) desirable visible transmission, and (iv) desirable glass side visible reflectivity ($R_GY$).

Measured monolithically after tempering (HT), Examples 1-2 according to embodiments of this invention had the following characteristics (HT, monolithic) (Ill. C, 2 degree observer).

TABLE 5

Measured Monolithic, HT (after tempering)

| Parameter | Ex. 1 | Ex. 2 |
| --- | --- | --- |
| $T_{vis}$ (TY)(transmission): | 33.0% | 33.1% |
| $a^*_T$ | −4.3 | −4.4 |
| $b^*_T$ | −3.1 | −3.1 |
| $R_GY$(glass side refl. %): | 17.2% | 17.2% |
| $a^*_G$: | −1.8 | −1.8 |
| $b^*_G$: | −1.1 | −1.0 |
| Glass side refl. color: | grey | grey |

TABLE 5-continued

Measured Monolithic, HT (after tempering)

| Parameter | Ex. 1 | Ex. 2 |
|---|---|---|
| $R_FY$(film side refl. %): | 4.1% | 4.0% |
| $a^*_F$: | 4.1 | 4.1 |
| $b^*_F$: | 4.4 | 3.9 |
| Sheet Resistance (Ω/sq): | 3.6 | 3.6 |

It can be seen from Table 5 above that following thermal tempering (HT) Examples 1-2 had a combination of (i) desirable grey glass side reflective visible color, (ii) low sheet resistance, (iii) desirable visible transmission values, and (iv) desirable glass side visible reflectivity ($R_GY$).

Measured in an IG window unit as shown in FIG. 2 (with the coating 30 on surface two) after HT, Examples 1-2 had the following characteristics (tempered, IG unit) (Ill. C, 2 degree observer).

TABLE 6

IG Unit, HT (after tempering)

| Parameter | Ex. 1 | Ex. 2 |
|---|---|---|
| $T_{vis}$ (TY)(transmission): | 29.5% | 33.1% |
| $a^*_T$ | −5.1 | −4.4 |
| $b^*_T$ | −2.7 | −3.1 |
| $R_GY$(glass side refl. %): | 18.1% | 17.2% |
| $a^*_G$: | −2.1 | −1.8 |
| $b^*_G$: | −1.3 | −1.0 |
| Glass side refl. color: | grey | grey |
| $R_FY$(film side refl. %): | 11.4% | 4.0% |
| $a^*_F$: | 0.8 | 4.1 |
| $b^*_F$: | 1.4 | 3.9 |
| Sheet Resistance (Ω/sq): | 3.6 | 3.6 |
| SF (EN410-673 2011): | 0.22 | 0.22 |
| SHGC (NFRC-2001): | 0.21 | 0.21 |

It can again be seen from the table above, following thermal tempering (HT), IG window units including Examples 1 and 2, respectively, had a combination of: (i) desirable grey glass side/exterior reflective visible color, (ii) low sheet resistance, (iii) desirable visible transmission values, (iv) desirable glass side/exterior visible reflectivity ($R_GY$), and (v) desirably low SF and SHGC values.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate and having grey glass side reflective color, the coating comprising:
 first and second infrared (IR) reflecting layers comprising silver, the first IR reflecting layer being located closer to the glass substrate than is the second IR reflecting layer;
 a first contact layer located over and directly contacting the first IR reflecting layer comprising silver;
 a dielectric layer comprising silicon nitride located over and directly contacting the first contact layer;
 wherein the dielectric layer comprising silicon nitride is split by a splitting absorber layer comprising Nb and Zr, so that the splitting absorber layer comprising Nb and Zr is located between and contacting a first portion of the dielectric layer comprising silicon nitride and a second portion of the dielectric layer comprising silicon nitride;
 a second contact layer located over the layer comprising silicon nitride;
 the second IR reflecting layer comprising silver located over and directly contacting the second contact layer;
 a third contact layer located over and directly contacting the second IR reflecting layer;
 another dielectric layer comprising silicon nitride located over the third contact layer;
 wherein the coated article has a visible transmission of from 20-45%, and a glass side visible reflectance of from 10-24%; and
 wherein the coated article has grey glass side reflective coloration so that the coated article has a glass side reflective a* value from −2.5 to 0 and a glass side reflective b* value from −7.0 to −1.0 (Ill. C, 2 degree observer).

2. The coated article of claim 1, wherein the absorber layer comprises a suboxide of NbZr.

3. The coated article of claim 1, wherein the absorber layer comprises a subnitride of NbZr.

4. The coated article of claim 1, wherein the absorber layer comprises $NbZrO_xN_y$.

5. The coated article of claim 1, wherein the first and third contact layers comprise Ni and/or Cr.

6. The coated article of claim 1, wherein the second contact layer comprises Ni and Cr.

7. The coated article of claim 1, further comprising a contact layer comprising NiCr located under and directly contacting the first IR reflecting layer.

8. The coated article of claim 1, wherein the coated article has a transmissive a* value from −8.0 to −1.0 and a transmissive b* value from −8.0 to +1.0.

9. The coated article of claim 1, wherein the coated article has a visible transmission from 22-39%.

10. The coated article of claim 1, wherein the coating has a sheet resistance no greater than 7.0 ohms/square.

11. The coated article of claim 1, wherein respective thicknesses of the first and second IR reflecting layers comprising silver are the same +/−10%.

12. The coated article of claim 1, wherein the absorber layer contains more Nb than Zr.

13. The coated article of claim 1, wherein the absorber layer contains from 3-30% oxygen (atomic %).

14. The coated article of claim 1, wherein a metal content of the absorber layer is from 70-95% Nb (atomic %).

15. The coated article of claim 1, further comprising a base layer comprising silicon nitride located between the glass substrate and the first IR reflecting layer.

16. The coated article of claim 1, wherein the absorber layer has a thickness of from 15-100 angstroms.

17. The coated article of claim 1, wherein the absorber layer has a thickness of from 20-60 angstroms.

18. The coated article of claim 1, wherein the first and second portions of the dielectric layer comprising silicon nitride are of the same thickness +/−20%.

19. The coated article of claim 1, wherein the absorber layer consists essentially of $NbZrO_xN_y$.

20. The coated article of claim 1, wherein the absorber layer is thinner than both of the IR reflecting layers comprising silver.

21. The coated article of claim 1, further comprising an overcoat layer comprising zirconium oxide located over and directly contacting the another dielectric layer comprising silicon nitride.

22. The coated article of claim 1, wherein the first contact layer comprises NiCr and is substantially metallic or metallic, and contains no more than 5% (atomic %) oxygen.

23. The coated article of claim 1, wherein the first, second, and third contact layers comprise NiCr and are substantially metallic or metallic, and contain no more than 5% (atomic %) oxygen.

24. The coated article of claim 1, wherein the coated article is thermally tempered.

25. The coated article of claim 1, wherein the coated article has a glass side visible reflectance from 12-20%.

26. The coated article of claim 1, wherein the coated article has a film side reflective b* value from −3 to +7.

27. A IG window unit including the coated article of claim 1, and another glass substrate which is coupled to said coated article, wherein the IG window unit has an SF value no greater than 0.28 and an SHGC value no greater than 0.29.

28. A IG window unit including the coated article of claim 1, and another glass substrate which is coupled to said coated article, wherein the IG window unit has an SF value no greater than 0.25 and an SHGC value no greater than 0.25.

29. A IG window unit including the coated article of claim 1, and another glass substrate which is coupled to said coated article, wherein the IG window unit has an SF value no greater than 0.23 and an SHGC value no greater than 0.23.

30. A coated article including a coating supported by a glass substrate and having grey glass side reflective color, the coating comprising:
first and second infrared (IR) reflecting layers comprising silver, the first IR reflecting layer being located closer to the glass substrate than is the second IR reflecting layer;
a first contact layer located over and directly contacting the first IR reflecting layer comprising silver;
a dielectric layer comprising silicon nitride located over and directly contacting the first contact layer;
wherein the dielectric layer comprising silicon nitride is split by a splitting absorber layer, so that the splitting absorber layer is located between and contacting a first portion of the dielectric layer comprising silicon nitride and a second portion of the dielectric layer comprising silicon nitride;
a second contact layer located over the layer comprising silicon nitride;
the second IR reflecting layer comprising silver located over and directly contacting the second contact layer;
a third contact layer located over and directly contacting the second IR reflecting layer;
another dielectric layer comprising silicon nitride located over the third contact layer;
wherein the coated article has a visible transmission of from 20-45%; and
wherein the coated article has grey glass side reflective coloration so that the coated article has a glass side reflective a* value from −2.5 to 0 and a glass side reflective b* value from −7.0 to −1.0 (Ill. C, 2 degree observer).

31. A coated article including a coating supported by a glass substrate, the coating comprising:
first and second infrared (IR) reflecting layers comprising silver, the first IR reflecting layer being located closer to the glass substrate than is the second IR reflecting layer;
a first contact layer located over and directly contacting the first IR reflecting layer comprising silver;
a dielectric layer comprising silicon nitride located over and directly contacting the first contact layer;
wherein the dielectric layer comprising silicon nitride is split by a splitting layer comprising $NbZrO_xN_y$, so that the splitting layer comprising $NbZrO_xN_y$ is located between and contacting a first portion of the dielectric layer comprising silicon nitride and a second portion of the dielectric layer comprising silicon nitride;
a second contact layer located over the layer comprising silicon nitride;
the second IR reflecting layer comprising silver located over and directly contacting the second contact layer;
a third contact layer located over and directly contacting the second IR reflecting layer;
wherein the coated article has a visible transmission of from 20-45%; and
wherein the coated article has grey glass side reflective coloration so that the coated article has a glass side reflective a* value from −2.5 to 0 and a glass side reflective b* value from −7.0 to −1.0 (Ill. C, 2 degree observer).

32. The coated articled of claim 31, wherein the coated article has grey glass side reflective coloration so that the coated article has a glass side reflective a* value from −4.0 to +5.0 and a glass side reflective b* value from −10.0 to +2.0.

* * * * *